United States Patent
Imamura et al.

(10) Patent No.: US 11,993,740 B2
(45) Date of Patent: May 28, 2024

(54) LOW DIELECTRIC RESIN COMPOSITION, MOLDED ARTICLE, FILM, MULTILAYER FILM AND FLEXIBLE PRINTED WIRING BOARD

(71) Applicant: KANEKA CORPORATION, Osaka (JP)

(72) Inventors: Yuichi Imamura, Osaka (JP); Keisuke Oguma, Osaka (JP); Masayoshi Kido, Osaka (JP)

(73) Assignee: KANEKA CORPORATION, Osaka (JP)

( * ) Notice: Subject to any disclaimer, the term of this patent is extended or adjusted under 35 U.S.C. 154(b) by 155 days.

(21) Appl. No.: 17/508,218

(22) Filed: Oct. 22, 2021

(65) Prior Publication Data
US 2022/0041932 A1   Feb. 10, 2022

Related U.S. Application Data

(63) Continuation of application No. PCT/JP2020/017463, filed on Apr. 23, 2020.

(30) Foreign Application Priority Data

Apr. 26, 2019   (JP) ................ 2019-086110

(51) Int. Cl.
| | |
|---|---|
| G02F 1/1333 | (2006.01) |
| C09K 19/02 | (2006.01) |
| C09K 19/38 | (2006.01) |
| C09K 19/54 | (2006.01) |
| H05K 1/02 | (2006.01) |
| C08F 255/02 | (2006.01) |
| C08L 51/00 | (2006.01) |

(52) U.S. Cl.
CPC .............. *C09K 19/38* (2013.01); *C09K 19/02* (2013.01); *C09K 19/542* (2013.01); *H05K 1/024* (2013.01); *C08F 255/023* (2013.01); *C08L 51/003* (2013.01); *C09K 2219/03* (2013.01); *H05K 2201/0141* (2013.01); *H05K 2201/0158* (2013.01); *H05K 2201/0183* (2013.01)

(58) Field of Classification Search
CPC .... C09K 19/38; C09K 19/3804; C09K 19/02; C09K 19/542; C09K 2019/0444; C09K 2019/0448; C09K 2219/03; G02F 1/1333; H05K 2201/0141

See application file for complete search history.

(56) References Cited

U.S. PATENT DOCUMENTS

2012/0301718 A1    11/2012   Nishiura et al.
2022/0041932 A1*    2/2022   Imamura ............... C09K 19/02

FOREIGN PATENT DOCUMENTS

| JP | H06-073239 A | 3/1994 |
|---|---|---|
| JP | H07-062172 A | 3/1995 |
| JP | H10-258491 A | 9/1998 |
| JP | H10-330602 A | 12/1998 |
| JP | 2002064030 A | 2/2002 |
| JP | 2012077117 A | 4/2012 |
| TW | 201134654 A | 10/2011 |

OTHER PUBLICATIONS

International Search Report issued in corresponding International Application No. PCT/JP2020/017463 dated Jul. 7, 2020 (5 pages).
Written Opinion of the International International Searching Authority issued in corresponding International Application No. PCT/JP2020/017463 dated Jul. 7, 2020 (4 pages).
Office Action issued in Tawainese Application No. 109113776; Dated Feb. 21, 2024 (13 pages).

* cited by examiner

*Primary Examiner* — Geraldina Visconti
(74) *Attorney, Agent, or Firm* — Osha Bergman Watanabe & Burton LLP

(57) ABSTRACT

The present disclosure provides a low dielectric resin composition having good melt processability and excellent low dielectric characteristics in a high frequency band as compared to low dielectric materials such as liquid crystal polymers. A molded article and a film, each of which is formed from the low dielectric resin composition, a multilayer film obtained by superposing a metal foil on at least one main surface of the film, and a flexible printed wiring board which includes the film are also provided. The present disclosure includes, as a low dielectric resin composition, a resin composition which contains (A) a liquid crystal polymer and (B) a graft-modified polyolefin having a polar group. The low dielectric resin composition has a dielectric constant of 2.80 or less at a frequency of 10 GHz and a dielectric loss tangent of 0.0025 or less at a frequency of 10 GHz.

11 Claims, No Drawings

LOW DIELECTRIC RESIN COMPOSITION, MOLDED ARTICLE, FILM, MULTILAYER FILM AND FLEXIBLE PRINTED WIRING BOARD

TECHNICAL FIELD

One or more embodiments of the present invention relate to a low dielectric resin composition; a molded article and a film each including the low dielectric resin composition; a multilayer film including the film and a metal foil provided on at least one main surface of the film; and a flexible printed wiring board including a film including the low dielectric resin composition.

BACKGROUND

In recent years, communication devices, such as smartphones, and electronic devices, such as next-generation televisions, have been required to achieve high-speed transmission and reception of large-volume data. Associated with this trend, electrical signal frequency has become higher. Specifically, in the field of wireless communication, the fifth generation mobile communication system (5G) is expected to be launched around 2020. To launch the 5G, operation at a frequency band as high as 10 GHz or more has been investigated.

Unfortunately, as the frequency of signals for operation increases, output signal quality decreases, namely, transmission loss increases, which could lead to false recognition of information. The transmission loss is composed of conductor loss, caused by a conductor, and dielectric loss, caused by insulating resin in electrical or electronic components, such as electronic or communication device boards, in which the conductor and dielectric losses are respectively proportional to the 0.5-th power and one power of the operation frequency. Therefore, the dielectric loss has a very high impact at a high-frequency band, particularly, at a GHz band.

In order to reduce the transmission loss, therefore, a need exists for low dielectric materials having a low level of relative permittivity and dielectric dissipation factor, which are dielectric loss related factors. Under such circumstances, for example, studies have been conducted on use of a liquid crystal polymer as a low dielectric material in a high frequency range (see Patent Document 1).

Patent Document 1: Japanese Unexamined Patent Application, Publication No. 2012-077117

For a further reduction in transmission loss, however, lower dielectric properties are required of such a low dielectric resin as a liquid crystal polymer or a composition thereof.

The liquid crystal polymer is difficult to melt-process due to its anisotropy. For example, if the liquid crystal polymer is subjected to an extrusion process, which is a typical method for forming a film, the liquid crystal polymer melt discharged from the die will immediately drip off due to a melt viscosity reduction caused by the shear force in the discharging direction, which makes it difficult to draw a film. Even if it is possible to draw a film, the resulting film can tear very easily because of the orientation of the liquid crystal polymer in the film.

The liquid crystal polymer has an additional problem in that its anisotropy makes it difficult to perform pellet production by cutting a strand. Specifically, for example, the liquid crystal polymer strand cannot be cut into pellets, or even if its strand can be cut into pellets, the resulting cut surface will be not clean, or the resulting pellets will tend to have whiskers. Unevenness in the pellet shape or whiskers on the pellets will be a cause of unstable measurement of the amount of the liquid crystal polymer in the process of shaping the liquid crystal polymer.

SUMMARY

One or more embodiments of the present invention provide a low dielectric resin composition having good melt processability and having excellent low dielectric properties in a high frequency range as compared to those of such a low dielectric material as a liquid crystal polymer; a molded article and a film each including such a low dielectric resin composition; a multilayer film including such a film and a metal foil provided on at least one main surface of such a film; and a flexible printed wiring board including such a film.

As a result of intensive studies, the present inventors have completed one or more embodiments of the present invention.

Specifically, one or more embodiments of the present invention provide the following aspects (1) to (12).

(1) A low dielectric resin composition including:
a liquid crystal polymer (A); and
a graft-modified polyolefin (B) having a polar group,
in which the low dielectric resin composition has:
a relative permittivity lower than that of the liquid crystal polymer (A) at a frequency of 10 GHz; and
a dielectric dissipation factor lower than that of the graft-modified polyolefin (B) at a frequency of 10 GHz.

(2) The low dielectric resin composition according to aspect (1), having a relative permittivity of 2.80 or less at a frequency of 10 GHz.

(3) The low dielectric resin composition according to aspect (1) or (2), having a dielectric dissipation factor of 0.0025 or less at a frequency of 10 GHz.

(4) The low dielectric resin composition according to any one of aspects (1) to (3), having at least a portion having a sea-island structure including the liquid crystal polymer (A) and the graft-modified polyolefin (B).

(5) The low dielectric resin composition according to aspect (4), having a sea-island structure containing the liquid crystal polymer (A) as a sea component or having a sea-island structure and a co-continuous structure in which both the liquid crystal polymer (A) and the graft-modified polyolefin (B) form a continuous phase.

(6) The low dielectric resin composition according to any one of aspects (1) to (5), wherein the liquid crystal polymer (A) has a melting point of 250° C. or more.

(7) The low dielectric resin composition according to any one of aspects (1) to (6), wherein the polar group is an epoxy group.

(8) The low dielectric resin composition according to any one of aspects (1) to (7), wherein the graft-modified polyolefin (B) is a polyolefin graft-modified with glycidyl (meth)acrylate and styrene.

(9) The low dielectric resin composition according to any one of aspects (1) to (8), wherein the graft-modified polyolefin (B) has a melting point of 200° C. or more.

(10) A molded article including the low dielectric resin composition according to any one of aspects (1) to (9).

(11) A film including the low dielectric resin composition according to any one of aspects (1) to (9).

(12) A multilayer film including: the film according to aspect (11); and a metal foil provided on at least one main surface of the film.

(13) A flexible printed wiring board including the film according to aspect (11).

DETAILED DESCRIPTION OF THE EMBODIMENTS

One or more embodiments of the present invention make it possible to provide a low dielectric resin composition having good melt processability and having excellent low dielectric properties in a high frequency range as compared to those of such a low dielectric material as a liquid crystal polymer; a molded article and a film each including such a low dielectric resin composition; a multilayer film including such a film and a metal foil provided on at least one main surface of such a film; and a flexible printed wiring board including such a film.

Low Dielectric Resin Composition

The low dielectric resin composition is a resin composition including a liquid crystal polymer (A) and a graft-modified polyolefin (B) having a polar group. At a frequency of 10 GHz, the low dielectric resin composition has a relative permittivity lower than the relative permittivity of the liquid crystal polymer (A) at 10 GHz. At a frequency of 10 GHz, the low dielectric resin composition has a dielectric dissipation factor equal to or lower than minimum one of the dielectric dissipation factors of the graft-modified polyolefin (B) at 10 GHz. At 10 GHz, the low dielectric resin composition may have a dielectric dissipation factor of 0.0025 or less. The dielectric dissipation factor may not have any specific lower limit. For example, the dielectric dissipation factor may have a lower limit of 0.0005 or more or 0.0010 or more.

At a frequency of 10 GHz, the low dielectric resin composition may have a relative permittivity of 2.80 or less. The relative permittivity may not have any specific lower limit. For example, the relative permittivity may have a lower limit of 2.00 or more or 2.50 or more.

Thanks to its low dielectric properties, the low dielectric resin composition is suitable for use in applications such as electric and electronic parts to be used in high frequency ranges, information and communication devices, and components for information and communication devices.

The low dielectric resin composition can be in various phase states depending on various conditions, such as the blend ratio of the liquid crystal polymer (A) and the graft-modified polyolefin (B), the melting point of the liquid crystal polymer (A), the melting point of the graft-modified polyolefin (B), the difference between the melting points of the liquid crystal polymer (A) and the graft-modified polyolefin (B), the temperature at which the liquid crystal polymer (A) is blended with the graft-modified polyolefin (B), and the modification degree of the graft-modified polyolefin (B).

At least part of the low dielectric resin composition may have a sea-island structure including the liquid crystal polymer (A) and the graft-modified polyolefin (B). Any one of the liquid crystal polymer (A) and the graft-modified polyolefin (B) may be the sea component of the sea-island structure. In this regard, the expression "at least part of the low dielectric resin composition has a sea-island structure" means that, when any three target regions with a size of 100 μm×100 μm are observed in a cross-section of a sample of the low dielectric resin composition using an electron microscope (SEM), the sea-island structure is observed in at least one of the three regions. The low dielectric resin composition in such a phase state has good melt processability because the inherent anisotropy of the liquid crystal polymer (A) is reduced in the composition.

When having such a sea-island structure, the low dielectric resin composition may have a sea-island structure containing the liquid crystal polymer (A) as a sea component or may have a sea-island structure and a co-continuous structure in which both the liquid crystal polymer (A) and the graft-modified polyolefin (B) form a continuous phase. In this regard, the expression "the liquid crystal polymer (A) or the graft-modified polyolefin (B) forms a continuous phase" means that, when a cross-section of a sample of the low dielectric resin composition is observed with an electron microscope (SEM), the liquid crystal polymer (A) or the graft-modified polyolefin (B) is observed to form a region with no closed circumference in the field of view. The expression "the low dielectric resin composition has a sea-island structure and a co-continuous structure" means that, when any three target regions with a size of 100 μm×100 μm are observed in a cross-section of a sample of the low dielectric resin composition using an electron microscope (SEM), the sea-island structure is observed in the three regions and the co-continuous structure is observed in at least one of the three regions. In this case, the liquid crystal polymer (A) forms the sea component or the continuous phase of the co-continuous structure and thus is more likely to allow the low dielectric resin composition to exhibit high heat resistance derived from the liquid crystal polymer (A).

The low dielectric resin composition is produced by mixing the liquid crystal polymer (A) and the graft-modified polyolefin (B). The liquid crystal polymer (A) and the graft-modified polyolefin (B) may be mixed by any method. Preferred examples of the mixing method include methods using a melt kneader, such as a single or double screw extruder. The liquid crystal polymer (A) and the graft-modified polyolefin (B) may be mixed under any conditions that allow the liquid crystal polymer (A) and the graft-modified polyolefin (B) to be uniformly mixed while each component of the low dielectric resin composition is prevented from undergoing excessive thermal decomposition or sublimation. When a melt kneader is used, for example, the liquid crystal polymer (A) and the graft-modified polyolefin (B) may be melted and kneaded at a temperature 5° C. or more and 100° C. or less, or 10° C. or more and 50° C. or less, higher than the higher one of the melting points of the liquid crystal polymer (A) and the graft-modified polyolefin (B).

The low dielectric resin composition may contain an additional resin other than the liquid crystal polymer (A) and the graft-modified polyolefin (B). Based on the total mass of the resin components of the low dielectric resin composition, the total mass percentage of the liquid crystal polymer (A) and the graft-modified polyolefin (B) may be typically 80% by mass, 90% by mass or more, 95% by mass or more, or 100% by mass.

Examples of the additional resin include non-graft-modified polyolefins, non-liquid crystalline polyesters, such as polyethylene terephthalate and polybutylene terephthalate, polyamides, polyester amides, polyimides, polyamide imides, polycarbonates, polyacetals, polyphenylene sulfides, polyphenylene ethers, polysulfones, polyethersulfones, polyetherimides, silicone resins, and fluororesins.

If necessary, the low dielectric resin composition may contain an inorganic filler. Examples of the inorganic filler include calcium carbonate, talc, clay, silica, magnesium carbonate, barium sulfate, titanium oxide, alumina, montmorillonite, gypsum, glass flakes, glass fibers, milled glass fibers, carbon fibers, alumina fibers, silica alumina fibers, aluminum borate whiskers, and potassium titanate fibers. One of these inorganic fillers may be used alone, or two or more of these inorganic fillers may be used in combination. Depending on the intended use of the low dielectric resin composition, the content of such an inorganic filler may be determined within the range where the low dielectric properties of the low dielectric resin composition remain not compromised. For example, when the low dielectric resin composition is used to form a film, the upper limit of the inorganic filler content may be determined within the range where the inorganic filler does not significantly reduce the mechanical strength of the film.

If necessary, the low dielectric resin composition may further contain various additives, such as an organic filler, an antioxidant, a thermal stabilizer, a light stabilizer, a flame retardant, a lubricant, an antistatic agent, a coloring agent, an anticorrosive agent, a cross-linking agent, a foaming agent, a fluorescent agent, a surface smoothing agent, a surface gloss modifier, and a mold release improving agent. These additives may be used alone, or two or more of these additives may be used in combination.

Hereinafter, the liquid crystal polymer (A) and the graft-modified polyolefin (B) will be described.

Liquid Crystal Polymer

Any polymer that exhibits optical anisotropy when melted and is recognized as a thermotropic liquid crystal polymer by those skilled in the art may be used without restriction as the liquid crystal polymer. The optical anisotropy of the melt can be checked by a conventional polarization test method using orthogonal polarizers.

The liquid crystal polymer is typically produced by polycondensation of a monomer mixture including an acylation product of a monomer having a phenolic hydroxyl group. The polycondensation may be carried out in the presence of a catalyst. Examples of the catalyst include metal compounds, such as magnesium acetate, stannous acetate, tetrabutyl titanate, lead acetate, sodium acetate, potassium acetate, and antimony trioxide; and nitrogen-containing heterocyclic compounds, such as 1-methylimidazole. The catalyst may be used in an amount of, for example, 0.1 parts by mass or less based on 100 parts by mass of the monomer mixture (A).

As mentioned above, the monomer mixture is a mixture of monomers including an acylation product of a monomer having a phenolic hydroxyl group. The monomer mixture may contain a monomer having no phenolic hydroxyl group, such as an aromatic dicarboxylic acid represented by terephthalic acid or isophthalic acid.

In view of cost and production time, the method of preparing the monomer mixture may include acylating a monomer mixture including a monomer having a phenolic hydroxyl group to form a monomer mixture containing an acylation product of the monomer having a phenolic hydroxyl group.

Examples of the constitutional unit of the liquid crystal polymer include an aromatic oxycarbonyl unit, an aromatic dicarbonyl unit, an aromatic dioxy unit, an aromatic aminooxy unit, an aromatic diamino unit, an aromatic aminocarbonyl unit, and an aliphatic dioxy unit. The liquid crystal polymer may also contain an additional bond other than the ester bond, such as an amide bond or a thioester bond.

The aromatic oxycarbonyl unit is a unit derived from an aromatic hydroxycarboxylic acid. Preferred examples of the aromatic hydroxycarboxylic acid include p-hydroxybenzoic acid, m-hydroxybenzoic acid, o-hydroxybenzoic acid, 6-hydroxy-2-naphthoic acid, 5-hydroxy-2-naphthoic acid, 3-hydroxy-2-naphthoic acid, 4'-hydroxyphenyl-4-benzoic acid, 3'-hydroxyphenyl-4-benzoic acid, 4'-hydroxyphenyl-3-benzoic acid, and alkyl-, alkoxy-, or halogen-substituted derivatives thereof. Ester-forming derivatives, such as ester derivatives or acid halides of the aromatic hydroxycarboxylic acid, may also be used like the aromatic hydroxycarboxylic acid. Among these aromatic hydroxycarboxylic acids, p-hydroxybenzoic acid and 6-hydroxy-2-naphthoic acid are preferred because they can form a liquid crystal polymer whose mechanical properties or melting point is easily adjustable.

The aromatic dicarbonyl repeating unit is a unit derived from an aromatic dicarboxylic acid. Preferred examples of the aromatic dicarboxylic acid include terephthalic acid, isophthalic acid, 2,6-naphthalenedicarboxylic acid, 1,6-naphthalenedicarboxylic acid, 2,7-naphthalenedicarboxylic acid, 1,4-naphthalenedicarboxylic acid, 4,4'-dicarboxybiphenyl, and other aromatic dicarboxylic acids, and alkyl-, alkoxy-, or halogen-substituted derivatives thereof. Ester-forming derivatives, such as ester derivatives or acid halides of the aromatic dicarboxylic acid may also be used like the aromatic dicarboxylic acid. Among these aromatic dicarboxylic acids, terephthalic acid and 2,6-naphthalenedicarboxylic acid are preferred because they can form a liquid crystal polymer whose mechanical properties, heat resistance, melting point, or formability is easily adjustable to a suitable level.

The aromatic dioxy repeating unit is a unit derived from an aromatic diol. Preferred examples of the aromatic diol include hydroquinone, resorcin, 2,6-dihydroxynaphthalene, 2,7-dihydroxynaphthalene, 1,6-dihydroxynaphthalene, 1,4-dihydroxynaphthalene, 4,4'-dihydroxybiphenyl, 3,3'-dihydroxybiphenyl, 3,4'-dihydroxybiphenyl, 4,4'-dihydroxybiphenyl ether, and alkyl-, alkoxy- or halogen-substituted derivatives thereof. Among these aromatic diols, hydroquinone, resorcin, and 4,4'-dihydroxybiphenyl are preferred in terms of reactivity for polycondensation and the properties of the resulting liquid crystal polymer.

The aromatic aminooxy unit is a unit derived from an aromatic hydroxyamine. Preferred examples of the aromatic hydroxyamine include p-aminophenol, m-aminophenol, 4-amino-1-naphthol, 5-amino-1-naphthol, 8-amino-2-naphthol, 4-amino-4'-hydroxybiphenyl, and other aromatic hydroxyamines, and alkyl-, alkoxy-, or halogen-substituted derivatives thereof.

The aromatic diamino unit is a unit derived from an aromatic diamine. Preferred examples of the aromatic diamine include p-phenylenediamine, m-phenylenediamine, 1,5-diaminonaphthalene, 1,8-diaminonaphthalene, and other aromatic diamines, and alkyl-, alkoxy-, or halogen-substituted derivatives thereof.

The aromatic aminocarbonyl unit is a unit derived from an aromatic aminocarboxylic acid. Preferred examples of the aromatic aminocarboxylic acid include p-aminobenzoic acid, m-aminobenzoic acid, 6-amino-2-naphthoic acid, and other aromatic aminocarboxylic acids, and alkyl-, alkoxy-, or halogen-substituted derivatives thereof. Ester-forming derivatives, such as ester derivatives or acid halides of the aromatic aminocarboxylic acid, may also be used as monomers for forming the liquid crystal polymer.

Examples of the monomer for forming the aliphatic dioxy unit include aliphatic diols, such as ethylene glycol, 1,4-butanediol, and 1,6-hexanediol, and acylation products thereof. The liquid crystal polymer including the aliphatic dioxy unit may also be obtained by reacting an aliphatic dioxy unit-containing polymer, such as polyethylene terephthalate or polybutylene terephthalate, with the aromatic oxycarboxylic acid, the aromatic dicarboxylic acid, the aromatic diol, or an acylation product, ester derivative, or acid halide thereof.

The liquid crystal polymer may also contain a thioester bond. Examples of a monomer capable of forming such a bond include mercapto aromatic carboxylic acids, aromatic dithiols, and hydroxy aromatic thiols. Such monomers may be used in an amount of 10% by mole or less based on the total amount of the monomers capable of forming the aromatic oxycarbonyl repeating unit, the aromatic dicarbonyl repeating unit, the aromatic dioxy repeating unit, the aromatic aminooxy repeating unit, the aromatic diamino repeating unit, the aromatic aminocarbonyl repeating unit, the aromatic oxydicarbonyl repeating unit, and the aliphatic dioxy repeating unit.

Preferred examples of the liquid crystal polymer include the following polymers (1) to (25):

(1) 4-hydroxybenzoic acid-2-hydroxy-6-naphthoic acid copolymer;
(2) 4-hydroxybenzoic acid-terephthalic acid-4,4'-dihydroxybiphenyl copolymer;
(3) 4-hydroxybenzoic acid-terephthalic acid-isophthalic acid-4,4'-dihydroxybiphenyl copolymer;
(4) 4-hydroxybenzoic acid-terephthalic acid-isophthalic acid-4,4'-dihydroxybiphenyl-hydroquinone copolymer;
(5) 4-hydroxybenzoic acid-terephthalic acid-hydroquinone copolymer;
(6) 4-hydroxybenzoic acid-terephthalic acid-4,4'-dihydroxybiphenyl-hydroquinone copolymer;
(7) 2-hydroxy-6-naphthoic acid-terephthalic acid-hydroquinone copolymer;
(8) 4-hydroxybenzoic acid-2-hydroxy-6-naphthoic acid-terephthalic acid-4,4'-dihydroxybiphenyl copolymer;
(9) 2-hydroxy-6-naphthoic acid-terephthalic acid-4,4'-dihydroxybiphenyl copolymer;
(10) 4-hydroxybenzoic acid-2-hydroxy-6-naphthoic acid-terephthalic acid-hydroquinone copolymer;
(11) 4-hydroxybenzoic acid-2-hydroxy-6-naphthoic acid-terephthalic acid-hydroquinone-4,4'-dihydroxybiphenyl copolymer;
(12) 4-hydroxybenzoic acid-2,6-naphthalenedicarboxylic acid-4,4'-dihydroxybiphenyl copolymer;
(13) 4-hydroxybenzoic acid-terephthalic acid-2,6-naphthalenedicarboxylic acid-hydroquinone copolymer;
(14) 4-hydroxybenzoic acid-2,6-naphthalenedicarboxylic acid-hydroquinone copolymer;
(15) 4-hydroxybenzoic acid-2-hydroxy-6-naphthoic acid-2,6-naphthalenedicarboxylic acid-hydroquinone copolymer;
(16) 4-hydroxybenzoic acid-terephthalic acid-2,6-naphthalenedicarboxylic acid-hydroquinone-4,4'-dihydroxybiphenyl copolymer;
(17) 4-hydroxybenzoic acid-terephthalic acid-4-aminophenol copolymer;
(18) 2-hydroxy-6-naphthoic acid-terephthalic acid-4-aminophenol copolymer;
(19) 4-hydroxybenzoic acid-2-hydroxy-6-naphthoic acid-terephthalic acid-4-aminophenol copolymer;
(20) 4-hydroxybenzoic acid-terephthalic acid-4,4'-dihydroxybiphenyl-4-aminophenol copolymer;
(21) 4-hydroxybenzoic acid-terephthalic acid-ethylene glycol copolymer;
(22) 4-hydroxybenzoic acid-terephthalic acid-4,4'-dihydroxybiphenyl-ethylene glycol copolymer;
(23) 4-hydroxybenzoic acid-2-hydroxy-6-naphthoic acid-terephthalic acid-ethylene glycol copolymer;
(24) 4-hydroxybenzoic acid-2-hydroxy-6-naphthoic acid-terephthalic acid-4,4'-dihydroxybiphenyl-ethylene glycol copolymer; and
(25) 4-hydroxybenzoic acid-terephthalic acid-2,6-naphthalenedicarboxylic acid-4,4'-dihydroxybiphenyl copolymer.

As mentioned above, a monomer mixture containing a phenolic hydroxyl group-containing monomer may be acylated to produce a monomer mixture containing an acylation product of the phenolic hydroxyl group-containing monomer. The acylation may be performed by reacting the phenolic hydroxyl group with a fatty acid anhydride. The fatty acid anhydride may be, for example, acetic anhydride or propionic anhydride. In terms of price and handleability, acetic anhydride may be used.

The fatty acid anhydride may be used in an amount of 1.0 equivalent or more and 1.15 equivalents or less, or 1.03 equivalents or more and 1.10 equivalents or less, based on the amount of the phenolic hydroxyl group.

The monomer mixture containing a phenolic hydroxyl group-containing monomer and the fatty acid anhydride may be mixed and heated to undergo acylation so that a monomer mixture containing an acylation product of the phenolic hydroxyl group-containing monomer is obtained.

The resulting monomer mixture containing an acylation product of the phenolic hydroxyl group-containing monomer may be heated to undergo polycondensation, and fatty acids as by-products of the polycondensation may be removed by distillation, so that the liquid crystal polymer is obtained. The liquid crystal polymer may be produced only through melt polycondensation. In such a case, the melt polycondensation may be carried out at a temperature of 150° C. or more and 400° C. or less or a temperature of 250° C. or more and 370° C. or less. The liquid crystal polymer may be produced through two stages including melt polycondensation and the solid phase polymerization described later. In such a case, the melt polycondensation may be carried out at a temperature of 120° C. or more and 350° C. or less or a temperature of 200° C. or more and 300° C. or less. The polycondensation reaction may be carried out for any time period as long as the resulting liquid crystal polymer has a desired melting point or a desired molecular weight. For example, the polycondensation reaction may be carried out for a time period of 30 minutes or more and 5 hours or less. If necessary, the liquid crystal polymer produced by the method described above may be further subjected to polycondensation in which it is heated in a solidified state (solid phase) to form a higher molecular weight polymer.

The liquid crystal polymer (A) is obtained by the method described above. The liquid crystal polymer (A) may have any melting point as long as one or more embodiments of the present invention are not impaired. The liquid crystal polymer (A) may have a melting point of 250° C. or more, or 280° C. or more. On the other hand, the liquid crystal polymer (A) may have a melting point of 400° C. or less, or 350° C. or less, in view of processability and prevention of the decomposition of the graft-modified polyolefin (B) during the production of the low dielectric resin composition. The melting point of the liquid crystal polymer (A) is, for example, the temperature determined from crystal melting peaks measured at a rate of temperature increase of 20° C./min using a differential scanning calorimeter (hereinafter abbreviated as DSC). More specifically, a sample of the liquid crystal polymer is subjected to a measurement process that includes measuring an endothermic peak temperature (Tm1) while heating the sample at a rate of temperature increase of 20° C./minute from room temperature; then holding the sample for 10 minutes at a temperature 20° C. or more and 50° C. or less higher than Tm1; then cooling the sample at a rate of temperature decrease of 20° C./minute to room temperature; and then measuring an endothermic peak while heating the sample again at a rate of temperature increase of 20° C./minute, in which the melting point of the liquid crystal polymer is defined as the peak top temperature. The measurement device may be, for example, DSC Q1000 manufactured by TA Instruments.

Graft-Modified Polyolefin (B)

The graft-modified polyolefin may be any resin that is a product of modification of a polyolefin by grafting and has a polar group. As used herein, the term "polar group" refers to a polar atom group. Organic compounds with such a group have polar properties. Examples of the polar group that can be introduced into polyolefins by grafting include carboxy groups derived from unsaturated carboxylic acids, such as acrylic acid, methacrylic acid, maleic acid, fumaric acid, tetrahydrophthalic acid, itaconic acid, citraconic acid, crotonic acid, and isocrotonic acid; acid anhydride groups, halocarbonyl groups, carboxylic acid amide groups, imide groups, and carboxylic acid ester groups derived from derivatives of the unsaturated carboxylic acids, such as acid anhydrides, acid halides, amides, imides, and esters; and epoxy groups derived from epoxy group-containing vinyl monomers, such as glycidyl methacrylate, glycidyl acrylate, monoglycidyl maleate, diglycidyl maleate, monoglycidyl itaconate, diglycidyl itaconate, allyl monoglycidyl succinate, allyl diglycidyl succinate, diglycidyl p-styrenecarboxylate, allyl glycidyl ether, methacryl glycidyl ether, styrene-p-glycidyl styrene, p-glycidylstyrene, 3,4-epoxy-1-butene, 3,4-epoxy-3-methyl-1-buten, and vinylcyclohexene monooxide. Among these polar groups, the graft-modified polyolefin (B) may contain an epoxy group or groups so that it can easily form a low dielectric resin composition in a preferred phase state and produce good adhesion between the low dielectric resin composition and any other material used in contact with the low dielectric resin composition. The epoxy group can react with a phenolic hydroxyl group, a carboxyl group, or other functional groups in the liquid crystal polymer (A). Therefore, the graft-modified polyolefin (B) having an epoxy group(s) as the polar group and the liquid crystal polymer (A) have appropriate affinity for each other in the low dielectric resin composition and can easily form a preferred phase structure, such as a sea-island structure.

In the sea-island structure, the islands may have a diameter of 100 μm or less, 50 μm or less, or 10 μm or less. The island diameter may have any lower limit, which may be, for example, 1 μm or more, 2 μm or more, or 3 μm or more. For example, a thickness of 100 μm or less is required of some films for use in various electric and electronic devices, which have become smaller and thinner. The low dielectric resin composition is often used to form a film with a thickness of 100 μm or less. In view of this point, the islands may have a dimeter in the range of 1 μm or more and 100 μm or less so that variations in the properties of the film can be reduced while the advantageous effect of the sea-island structure as the phase structure is obtained. In this regard, the expression "islands have a dimeter of X μm or less" means that 90% or more, generally 95% or more, typically 99% or more of all regions of the island phase as a discontinuous phase have a size of X μm or less. The expression "islands have a diameter of Y μm or more" means that 90% or more, generally 95% or more, typically 99% or more of all regions of the island phase as a discontinuous phase have a size of Y μm or more. As used herein, the term "diameter" generally refers to the diameter of an island. When an island has a shape significantly different from a circle, the "diameter" is defined as its long axis (the length of a long side of the circumscribed rectangle of the island). In this case, the long axis is the length of a long side of the circumscribed rectangle of the island or the length of a side of the circumscribed square of the island. A method of determining the island diameter includes, for example, embedding, into a thermosetting resin, a film produced using the low dielectric resin composition as in the examples described below; polishing a cross-section in the thickness direction with an ion beam to expose a cross-section of the film; and observing the cross-section of the film with a scanning electron microscope.

The degree of modification with the epoxy group-containing vinyl monomer in the epoxy group-containing, graft-modified polyolefin (B) may be 10% by mass or less, 5% by mass or less, or 1% by mass or less. The degree of modification with the epoxy group-containing vinyl monomer may have any lower limit as long as one or more embodiments of the present invention are not impaired. The lower limit may be, for example, 0.1% by mass or more, 0.3% by mass or more, or 0.5% by mass or more. When the degree of modification with epoxy group-containing vinyl monomer in the epoxy group-containing, graft-modified polyolefin (B) is 0.1% by mass or more and 10% by mass or less, it is particularly easy to obtain a low dielectric resin composition having excellent processability and excellent low dielectric properties using the graft-modified polyolefin (B). The degree of modification with the epoxy group-containing vinyl monomer can be measured using a potentiometric automatic titrator (AT700 manufactured by Kyoto Electronics Manufacturing Co., Ltd.) according to JIS K 7236. The degree of modification with the epoxy group-containing vinyl monomer may be measured using the graft-modified polyolefin (B) obtained by recrystallization in xylene.

The graft-modified polyolefin (B) is typically a resin obtained by graft-modifying a polyolefin with a polar group-containing vinyl monomer in the presence of a radical polymerization initiator. The graft-modified polyolefin (B) may be a polyolefin graft-modified with a polar group-containing vinyl monomer and an aromatic vinyl monomer, or a polyolefin graft-modified with glycidyl (meth)acrylate and styrene.

Examples of the polyolefin include linear polyolefins, such as polyethylene, polypropylene, poly-1-butene, polyisobutylene, polymethylpentene, propylene-ethylene copolymer, ethylene-propylene-diene copolymer, ethylene-butene-1 copolymer, and ethylene-octene copolymer; and cyclic polyolefins, such as copolymers of cyclopentadiene and ethylene and/or propylene.

Among these polyolefins, polymethylpentene, polyethylene, polypropylene, and propylene-ethylene copolymer are preferred because they easily undergo the modification reaction, and polymethylpentene is more preferred for heat resistance and low dielectric properties.

Examples of the radical polymerization initiator, which may be used for the graft modification of the polyolefin, include ketone peroxides, such as methyl ethyl ketone peroxide and methyl acetoacetate peroxide; peroxyketals, such as 1,1-bis(tert-butylperoxy)-3,3,5-trimethylcyclohexane, 1,1-bis(tert-butylperoxy)cyclohexane, n-butyl-4,4-bis(tert-butylperoxy)valerate, and 2,2-bis(tert-butylperoxy)butane; hydroperoxides, such as permethane hydroperoxide, 1,1,3,3-tetramethylbutyl hydroperoxide, diisopropylbenzene hydroperoxide, and cumene hydroperoxide; dialkyl peroxides, such as dicumyl peroxide, 2,5-dimethyl-2,5-di (tert-butylperoxy)hexane, α,α'-bis(tert-butylperoxy-m-isopropyl)benzene, tert-butylcumyl peroxide, di-tert-butyl peroxide, and 2,5-dimethyl-2,5-di(tert-butylperoxy)hexyne-3; diacyl peroxides, such as benzoyl peroxide; and peroxydicarbonates, such as di(3-methyl-3-methoxybutyl)peroxydicarbonate and di-2-methoxybutyl peroxydicarbonate; and peroxyesters, such as tert-butyl peroxyoctate, tert-butyl peroxyisobutylate, tert-butyl peroxylaurate, tert-butyl peroxy-3,5,5-trimethylhexanoate, tert-butyl peroxyisopropylcarbonate, 2,5-dimethyl-2,5-di(benzoylperoxy)hexane, tert-butyl peroxyacetate, tert-butyl peroxybenzoate, and di-tert-butyl peroxyisophthalate. These radical polymerization initiators may be used alone, or a mixture of two or more of these polymerization initiators may be used.

The radical polymerization initiator may be used in any amount effective to allow the graft modification reaction to proceed successfully. The radical polymerization initiator may be used in an amount of 0.01 parts by mass or more and 10 parts by mass or less, or 0.2 parts by mass or more and 5 parts by mass or less, based on 100 parts by mass of the polyolefin.

Examples of the polar group-containing vinyl monomer, which may be used for the graft modification, include unsaturated carboxylic acids, such as acrylic acid, methacrylic acid, maleic acid, fumaric acid, tetrahydrophthalic acid, itaconic acid, citraconic acid, crotonic acid, and isocrotonic acid; derivatives of the unsaturated carboxylic acids, such as acid anhydrides, acid halides, amides, imides, and esters; and epoxy group-containing viny monomers, such as glycidyl methacrylate, glycidyl acrylate, monoglycidyl maleate, diglycidyl maleate, monoglycidyl itaconate, diglycidyl itaconate, monoglycidyl allylsuccinate, diglycidyl allylsuccinate, glycidyl p-styrenecarboxylate, allyl glycidyl ether, methacryl glycidyl ether, styrene-p-glycidyl ether, p-glycidyl styrene, 3,4-epoxy-1-butene, 3,4-epoxy-3-methyl-1-butene, and vinylcyclohexene monoxide.
Among these monomers, epoxy group-containing vinyl monomers are preferred, glycidyl methacrylate and glycidyl acrylate are more preferred, and glycidyl methacrylate is even more preferred. One of or a mixture of two or more of the polar group-containing vinyl monomers may be used.

When used for the graft modification of the polyolefin, the polar group-containing vinyl monomer may be added in an amount of 0.1 parts by mass or more and 12 parts by mass or less, 0.5 parts by mass or more and 10 parts by mass or less, or 1 part by mass or more and 8 parts by mass or less, based on 100 parts by mass of the polyolefin. A low dielectric resin composition in a preferred phase state with desired low dielectric properties can be easily obtained using the polyolefin modified with the polar group-containing vinyl monomer in an amount within such a range.

As mentioned above, the graft-modified polyolefin (B) may be a polyolefin graft-modified with a polar group-containing vinyl monomer and an aromatic vinyl monomer. This is because the use of a combination of a polar group-containing vinyl monomer and an aromatic vinyl monomer can stabilize the grafting reaction so that the polar group-containing vinyl monomer can be easily grafted in a desired amount.

Examples of the aromatic vinyl monomer include styrene; alkyl styrenes, such as o-methylstyrene, m-methylstyrene, p-methylstyrene, α-methylstyrene, β-methylstyrene, dimethylstyrene, and trimethylstyrene; chlorostyrenes, such as o-chlorostyrene, m-chlorostyrene, p-chlorostyrene, α-chlorostyrene, β-chlorostyrene, dichlorostyrene, and trichlorostyrene; bromostyrenes, such as o-bromostyrene, m-bromostyrene, p-bromostyrene, dibromostyrene, and tribromostyrene; fluorostyrenes, such as o-fluorostyrene, m-fluorostyrene, p-fluorostyrene, difluorostyrene, and trifluorostyrene; nitrostyrenes, such as o-nitrostyrene, m-nitrostyrene, p-nitrostyrene, dinitrostyrene, and trinitrostyrene; hydroxystyrenes, such as o-hydroxystyrene, m-hydroxystyrene, p-hydroxystyrene, dihydroxystyrene, and trihydroxystyrene; and dialkenyl benzenes, such as o-divinyl benzene, m-divinyl benzene, p-divinyl benzene, o-diisopropenyl benzene, m-diisopropenyl benzene, and p-diisopropenyl benzene. Among these aromatic vinyl monomers, styrene, α-methylstyrene, p-methylstyrene, o-divinyl benzene, m-divinyl benzene, p-divinyl benzene, or a divinyl benzene isomer mixture is preferred for low cost, and styrene is particularly preferred. One of or a mixture of two or more of the aromatic vinyl monomers may be used.

For the graft modification of the polyolefin, the polar group-containing aromatic vinyl monomer may be used in an amount of 0.1 parts by mass or more and 12 parts by mass or less, 0.5 parts by mass or more and 10 parts by mass or less, or 1 part by mass or more and 8 parts by mass or less, based on 100 parts by mass of the polyolefin.

For ease of melt kneading with the liquid crystal polymer (A), the graft-modified polyolefin (B) may have a melting point of 80° C. or more, 100° C. or more, or 200° C. or more. The upper limit of the melting point of the graft-modified polyolefin (B) may be, but not limited to, 350° C. or less, or 300° C. or less.

The low dielectric resin composition described above may be processed into a variety of molded articles by a variety of known processes, such as injection molding, extrusion molding, blow molding, and solution casting. The low dielectric resin composition, which has excellent low dielectric properties in high frequency ranges, may be processed into a film, which may be used to form a flexible printed wiring board with low transmission loss.

Preferred methods for producing a film from the low dielectric resin composition include the following methods (1) and (2):
  (1) A melt extrusion method using a T-die; and
  (2) A solution casting method. Specifically, the solution casting method includes casting an organic solvent solution of the low dielectric resin composition on a support; and then removing the organic solvent from the cast organic solvent solution by heating and/or decompression or other methods to obtain a film. Examples of the casting method include, but are not limited to, known methods using a die coater, Comma Coater (registered trademark), a reverse coater, and a knife coater. The method for removing the organic solvent may include heating. The heating method may include using a known heating device, such as a hot stove or a far-infrared heating furnace. The organic solvent solution of the low dielectric resin composition is obtained, for example, by mixing the low dielectric resin composition and xylene at a temperature of about 80° C. In this process, instead of the low dielectric resin composition, the two or more materials for forming the low dielectric resin composition may be mixed with xylene.

The film made of the low dielectric resin composition may have any appropriate thickness depending on the intended use of the film. For use in forming a flexible printed wiring board, the film may have a thickness of 5 μm or more and 200 μm or less, or 10 μm or more and 100 μm or less.

More specifically, the flexible printed wiring board is typically produced by a process that includes providing a multilayer film including the film of the low dielectric resin composition and a metal foil provided on the film; and subjecting the metal foil to etching to form wiring. Such a flexible printed wiring board has high transmission rate and low transmission loss and thus is advantageously used as a circuit board for high-frequency applications.

Examples of the method for obtaining a multilayer film including the film of the low dielectric resin composition and a metal foil provided on the film include the following methods (I) and (II):

(I) A method that includes subjecting the film of the low dielectric resin composition and a metal foil to thermal compression bonding to form a multilayer film. (II) A method that includes casting an organic solvent solution of the low dielectric resin composition on a metal foil; and removing the organic solvent from the cast organic solvent solution by heating and/or decompression or other methods to obtain a multilayer film. In the method (I), the film of the low dielectric resin composition and the metal foil may be subjected to thermal compression bonding using a method and conditions selected from known heating and pressing methods and conditions. In this method, the thermal compression bonding temperature can be set at a low level while the peel strength of the metal foil to the film is kept at as high as 5 N/cm or more because the low dielectric resin composition contains the graft-modified polyolefin (B), which has a relatively low melting point. The thermal compression bonding temperature may be 400° C. or less, or 200° C. or less. In the method (II), the film may be deposited on the metal foil by the same process as that in the solution casting method, except that the metal foil is used as a support. It should be noted that the metal foil only has to be provided on at least one main surface of the film in the multilayer film. That is, the metal foil may be provided only on one main surface of the film or on each of the two main surfaces of the film.

Any metal foil may be bonded to the film made of the low dielectric resin composition. Materials for metal foils used to form flexible printed wiring boards for electrical and electronic equipment applications include copper, copper alloys, nickel, nickel alloys (e.g., alloy 42), aluminum, aluminum alloys, and stainless steel. The metal foil used to form a flexible printed wiring board may be a copper foil, which has excellent conductivity and processability and high bonding strength to the film. The copper foil may be, for example, a rolled copper foil, an electrolytic copper foil, or the like. If necessary, a functional layer, such as a rust-proof layer, a heat resistant layer, and an adhesive layer may be provided on the surface of the metal foil described above. The metal foil may have any appropriate thickness selected depending on the intended use of the flexible printed wiring board.

In the multilayer film, which includes the film made of the low dielectric resin composition and the metal foil provided on the film, the metal foil may have a peel strength of 5 N/cm or more to the film, which is an index of how difficult it is to peel off the metal foil from the film. The peel strength may be measured according to JIS C 6471 "6.5 Peel Strength". Specifically, a 1 mm-wide portion of the metal foil may be peeled off under conditions at a peel angle of 90° and a peel rate of 100 mm/minute when the load for peeling off is determined to be the peel strength.

EXAMPLES

Hereinafter, one or more embodiments of the present invention will be described in more detail with reference to examples, which are not intended to limit one or more embodiments of the present invention.

Production Example 1

Production of Modified Polyolefin 1

Through a hopper inlet, 100 parts by mass of (a1) polymethylpentene resin (TPX-grade MX002 manufactured by Mitsui Chemicals, Inc.) and 1.5 parts by mass of (b1) 1,3-di(tert-butyl peroxyisopropyl)benzene (Perbutyl P manufactured by NOF Corporation) were supplied to a double screw extruder (46 mmφ, L/D=63, manufactured by Kobe Steel, Ltd.) with a cylinder temperature set at 230° C. and a screw rotation speed set at 150 rpm, and melted and kneaded. During the melting and kneading, 8 parts by mass of (c1) styrene and 8 parts by mass of (d1) glycidyl methacrylate were added to the extruder from a middle portion of the cylinder. The extruder was then evacuated under vacuum from its vent port, so that modified polyolefin resin pellets were obtained. The resulting resin pellets were dissolved in xylene at 130° C. and then cooled to room temperature again. The resulting precipitated recrystallized resin was subjected to the measurement of the degree of modification with glycidyl methacrylate using a potentiometric automatic titrator (AT700 manufactured by Kyoto Electronics Manufacturing Co., Ltd.) according to JIS K 7236. The resulting modified polyolefin 1 had a degree of modification with glycidyl methacrylate of 2.64% by mass.

Production Example 2

Production of Modified Polyolefin 2

Through a hopper inlet, 100 parts by mass of (a1) polymethylpentene resin (TPX-grade MX002 manufactured by Mitsui Chemicals, Inc.) and 0.5 parts by mass of (b1) 1,3-di(tert-butyl peroxyisopropyl)benzene (Perbutyl P manufactured by NOF Corporation) were supplied to a double screw extruder (46 mmφ, L/D=63, manufactured by Kobe Steel, Ltd.) with a cylinder temperature set at 230° C. and a screw rotation speed set at 150 rpm, and melted and kneaded. During the melting and kneading, 2 parts by mass of (c1) styrene and 2 parts by mass of (d1) glycidyl methacrylate were added to the extruder from a middle portion of the cylinder. The extruder was then evacuated under vacuum from its vent port, so that modified polyolefin resin pellets were obtained. The resulting resin pellets were dissolved in xylene at 130° C. and then cooled to room temperature again. The resulting precipitated recrystallized resin was subjected to the measurement of the degree of modification with glycidyl methacrylate using a potentiometric automatic titrator (AT700 manufactured by Kyoto Electronics Manufacturing Co., Ltd.) according to JIS K 7236. The resulting modified polyolefin 2 had a degree of modification with glycidyl methacrylate of 0.74% by mass.

Production Example 3

Production of Modified Polyolefin 3

Through a hopper inlet, 100 parts by mass of (a1) polymethylpentene resin (TPX-grade MX002 manufactured by Mitsui Chemicals, Inc.) and 2.6 parts by mass of (b1) 1,3-di(tert-butyl peroxyisopropyl)benzene (Perbutyl P manufactured by NOF Corporation) were supplied to a double screw extruder (46 mmφ, L/D=63, manufactured by Kobe Steel, Ltd.) with a cylinder temperature set at 230° C. and a screw rotation speed set at 150 rpm, and melted and kneaded. During the melting and kneading, 12.0 parts by mass of (cl) styrene and 12.0 parts by mass of (d1) glycidyl methacrylate were added to the extruder from a middle portion of the cylinder. The extruder was then evacuated under vacuum from its vent port, so that modified polyolefin resin pellets were obtained. The resulting resin pellets were dissolved in xylene at 130° C. and then cooled to room temperature again. The resulting precipitated recrystallized resin was subjected to the measurement of the degree of modification with glycidyl methacrylate using a potentiometric automatic titrator (AT700 manufactured by Kyoto Electronics Manufacturing Co., Ltd.) according to JIS K 7236. The resulting modified polyolefin 3 had a degree of modification with glycidyl methacrylate of 4.29% by mass.

Production Example 4

Production of Modified Polyolefin 4

Through a hopper inlet, 100 parts by mass of (a1) polymethylpentene resin (TPX-grade MX002 manufactured by Mitsui Chemicals, Inc.) and 0.25 parts by mass of (b1) 1,3-di(tert-butyl peroxyisopropyl)benzene (Perbutyl P manufactured by NOF Corporation) were supplied to a double screw extruder (46 mmφ, L/D=63, manufactured by Kobe Steel, Ltd.) with a cylinder temperature set at 230° C. and a screw rotation speed set at 150 rpm, and melted and kneaded. During the melting and kneading, 1 part by mass of (cl) styrene and 1 part by mass of (d1) glycidyl methacrylate were added to the extruder from a middle portion of the cylinder. The extruder was then evacuated under vacuum from its vent port, so that modified polyolefin resin pellets were obtained. The resulting resin pellets were dissolved in xylene at 130° C. and then cooled to room temperature again. The resulting precipitated recrystallized resin was subjected to the measurement of the degree of modification with glycidyl methacrylate using a potentiometric automatic titrator (AT700 manufactured by Kyoto Electronics Manufacturing Co., Ltd.) according to JIS K 7236. The resulting modified polyolefin 4 had a degree of modification with glycidyl methacrylate of 0.35% by mass.

Examples 1 to 12 and Comparative Examples 1 to 6 A wholly aromatic liquid crystal polyester resin with a melting point of 280° C. was used as the liquid crystal polymer (A) ((A) component) in the examples and the comparative examples. In the examples, the modified polyolefins 1 to 4 obtained in Production Examples 1 to 4 were used as the graft-modified polyolefin (B) ((B) component). In the comparative examples, the resin to be mixed with the liquid crystal polymer (A) was unmodified polymethylpentene or an ethylene-glycidyl methacrylate-methyl acrylate-vinyl acetate copolymer (Bond Fast 7L (BF-7L) manufactured by Sumitomo Chemical Co., Ltd.). Bond fast 7L is a non-graft modified resin having epoxy groups as polar groups.

The specific amount of each material shown in Tables 1 to 4 was supplied through a hopper inlet to a double screw extruder (25 mmφ, L/D=40, manufactured by Technovel Corporation) with a cylinder temperature set at 300° C. and a screw rotation speed set at 150 rpm, and melted and kneaded to form a resin composition of each of the examples and the comparative examples. In Comparative Examples 1 to 4, the liquid crystal polymer (A), the modified polyolefin 1, the modified polyolefin 2, or Bond Fast 7L was used alone for evaluation. The resin or resin composition of each of the examples and the comparative examples was evaluated for relative permittivity, dielectric dissipation factor, heat resistance, and processability by the methods shown below. Tables 1 to 4 show the results of the evaluations.

Relative Permittivity and Dielectric Dissipation Factor

The permittivity and dielectric dissipation factor of each resin or resin composition were measured at the frequency shown below using a cavity resonator perturbation complex permittivity analyzer.

Measurement frequency: 10 GHz

Measurement conditions: temperature 22° C. to 24° C., humidity 45% to 55%

Measurement sample: sample having been allowed to stand for 24 hours under the above measurement conditions Heat Resistance The temperature (° C.) at which the storage elastic modulus of the sample reached $10^7$ MPa or less was measured using a dynamic viscoelastometer.

Sample measurement range: 5 mm wide, 20 mm distance between grippers

Measurement temperature range: 25° C. to 260° C.

Rate of temperature increase: 5° C./min

Strain amplitude: 0.1%

Measurement frequency: 1 Hz

Minimum tension/compression force: 0.1 g

Force amplitude initial value: 100 g

Processability

The strand obtained after the melting and kneading by the double screw extruder (25 mmφ, L/D=40, manufactured by Technovel Corporation) was cooled with water and then subjected to cutting with a pelletizer, during which the processability was evaluated according to the following criteria.

Very Good: Cylindrical pellets are successfully obtained with no cracks or chipping.

Good: Some of the pellets are cracked or chipped, and some pellets are flattened.

Poor: The strand fails to be cut into pellets, or most of the resulting pellets have whiskers or are cracked or chipped.

Phase Structure

The phase structure of each composition was observed with a microscope. The results of the observation were classified according to the criteria shown below. Table 1 shows the results of the observation.

A: Sea-island structure in which (A) component forms the sea.

B: Sea-island structure in which (A) component forms the islands.

C: Co-continuous structure with sea-island structure in part

D: Phase separation

TABLE 1

|  |  | Example | | |
|---|---|---|---|---|
|  |  | 1 | 2 | 3 |
| Component (A) (Parts by mass) |  | 80 | 75 | 70 |
| Component (B) (Parts by mass) | Modified polyolefin 1 | 20 | 25 | 30 |
|  | Modified polyolefin 2 | — | — | — |
|  | Modified polyolefin 3 | — | — | — |
|  | Modified polyolefin 4 | — | — | — |

TABLE 1-continued

|  | Example | | |
|---|---|---|---|
|  | 1 | 2 | 3 |
| Relative permittivity (10 GHz) | 2.62 | 2.58 | 2.57 |
| Dielectric dissipation factor (10 GHz) | 0.0022 | 0.0023 | 0.0023 |
| Processability | Good | Good | Good |
| Heat resistance | 260< | 260< | 260< |
| Phase structure | A | A | C |

TABLE 2

|  |  | Example | | | | | | |
|---|---|---|---|---|---|---|---|---|
|  |  | 4 | 5 | 6 | 7 | 8 | 9 | 10 |
| Component (A) (Parts by mass) |  | 95 | 90 | 85 | 80 | 75 | 50 | 25 |
| Component (B) (Parts by mass) | Modified polyolefin 1 | 5 | 10 | 15 | 20 | 25 | 50 | 75 |
|  | Modified polyolefin 2 |  |  |  |  |  |  |  |
|  | Modified polyolefin 3 |  |  |  |  |  |  |  |
|  | Modified polyolefin 4 |  |  |  |  |  |  |  |
| Relative permittivity (10 GHz) |  | 2.74 | 2.61 | 2.59 | 2.40 | 2.52 | 2.21 | 2.09 |
| Dielectric dissipation factor (10 GHz) |  | 0.0022 | 0.0020 | 0.0022 | 0.0021 | 0.0023 | 0.0018 | 0.0016 |
| Processability |  | Good | Good | Good | Good | Very good | Very good | Very good |
| Heat resistance |  | 260< | 260< | 260< | 260< | 200< | 200< | 200< |
| Phase structure |  | A | A | A | A | B | B | B |

TABLE 3

|  |  | Example | |
|---|---|---|---|
|  |  | 11 | 12 |
| Component (A) (Parts by mass) |  | 80 | 70 |
| Component (B) (Parts by mass) | Modified polyolefin 1 | — | — |
|  | Modified polyolefin 2 | — | — |
|  | Modified polyolefin 3 | 20 | — |
|  | Modified polyolefin 4 | — | 30 |
| Relative permittivity (10 GHz) |  | 2.62 | 2.55 |
| Dielectric dissipation factor (10 GHz) |  | 0.0022 | 0.0020 |
| Processability |  | Good | Very good |
| Heat resistance |  | 260< | 200< |
| Phase structure |  | A | B |

TABLE 4

| Component (A) (Parts by mass) |  | Comparative example | | | | | |
|---|---|---|---|---|---|---|---|
|  |  | 1 | 2 | 3 | 4 | 5 | 6 |
| Component (A) (Parts by mass) |  | 100 | — | — | — | 75 | 75 |
| Component (B) (Parts by mass) | Modified polyolefin 1 | — | 100 | — | — | — | — |
|  | Modified polyolefin 2 | — | — | — | 100 | — | 25 |
| 未変性ポリメチルペンテン |  | — | — | — | — | 25 | — |
| ボンドファスト 7L |  | — | — | 100 | — | — | 25 |
| Relative permittivity (10 GHz) |  | 2.98 | 1.96 | 1.97 | 2.32 | 2.35 | 2.63 |
| Dielectric dissipation factor (10 GHz) |  | 0.0021 | 0.0056 | 0.0027 | 0.0259 | 0.0016 | 0.0082 |
| Processability |  | Poor | Very good | Very good | Good | Poor | Good |
| Heat resistance |  | 260< | 200< | 200< | 200> | 260< | 260< |
| Phase structure |  | — | — | — | — | D | A |

The composition including the liquid crystal polymer (A) and the polar group-containing, graft-modified polyolefin (B) according to each of the examples has been found to have both good low dielectric properties and excellent melt processability. On the other hand, the liquid crystal polymer (A) alone, the polar group-containing, graft-modified polyolefin alone, the polar group-containing, non-graft modified resin alone, or the composition obtained by blending the liquid crystal polymer (A) with the unmodified polyolefin or the polar group-containing, non-graft modified resin has been found to be inferior in at least one of low dielectric property and melt processability.

Example 13 and Comparative Example 7

In Example 13, the resin composition obtained in Example 9 was used to form a double-sided copper-clad multilayer film including the film of the resin composition and a copper foil. In Comparative Example 7, the liquid crystal polymer (A) shown for Comparative Example 1 was used to form a double-sided copper-clad multilayer film in a manner similar to that in Example 13. Specifically, the double-sided copper-clad multilayer film was produced according to the method shown below. A 12 μm-thick copper foil was used whose surface to be in contact with the resin composition had a surface roughness Ra of 0.45 μm or less. The width w of the wiring to be made of the copper foil was calculated from the following equation.

$$Z = (d/\varepsilon \times w)^{0.5}$$

In the formula, Z is the characteristic impedance, which is 50 Ω,
d is the thickness of the film, which is 100 μm, and
ε is the permittivity of the resin composition. The thermal compression bonding was performed under the conditions of a temperature of 360° C., a pressure of 0.8 tons, and a lamination speed of 1 m/minute.

A microstrip line with a length of 10 cm was formed on the double-sided copper-clad multilayer film produced from the film of the resin composition and the copper foil. Specifically, the multilayer film was subjected to drilling, subsequent through-hole plating, and patterning, which was followed by bonding a coverlay film CISV 1225 (manufactured by Nikkan Industries Co., Ltd.) to the multilayer film by heating at 160° C. for 90 minutes and then plating the measurement pad portions with gold, so that a microstrip line test piece was obtained. The resulting test piece was subjected to peel strength measurement and transmission loss measurement. The transmission loss was measured as follows. The test piece was dried at 150° C. for 30 minutes and then subjected to moisture conditioning for at least 24 hours in a test room adjusted to 23° C. and 55% RH. Subsequently, the test piece was measured for transmission loss S21 parameter using Network Analyzer E5071C (Keysight Technologies) and Probe Station GSG250 so that the transmission loss (dB/100 mm) at a measurement frequency of 10 GHz was determined.

The test piece produced using the double-sided copper-clad multilayer sheet of Example 13 had a transmission loss of −1.9, which was lower than the transmission loss −2.1 of the test piece produced using the double-sided copper-clad multilayer sheet of Comparative Example 7.

Although the disclosure has been described with respect to only a limited number of embodiments, those skilled in the art, having benefit of this disclosure, will appreciate that various other embodiments may be devised without departing from the scope of the present disclosure. Accordingly, the scope of the invention should be limited only by the attached claims.

The invention claimed is:

1. A low dielectric resin composition comprising:
a liquid crystal polymer (A); and
a graft-modified polyolefin (B) having a polar group,
wherein the low dielectric resin composition has a sea-island structure comprising the liquid crystal polymer (A) and the graft-modified polyolefin (B) having a polar group,
wherein the sea-island structure is observed in at least one of three target regions with a size of 100 μm by 100 μm in a cross-section of the low dielectric resin composition, and
wherein the low dielectric resin composition has:
a relative permittivity lower than that of the liquid crystal polymer (A) at a frequency of 10 GHz,
a dielectric dissipation factor lower than that of the graft-modified polyolefin (B) at the frequency of 10 GHz,
a relative permittivity of 2.80 or less at the frequency of 10 GHz, and
a dielectric dissipation factor of 0.0025 or less at the frequency of 10 GHz.

2. The low dielectric resin composition according to claim 1, wherein the liquid crystal polymer (A) comprised in the sea-island structure is a sea component of the sea-island structure.

3. The low dielectric resin composition according to claim 1, wherein the liquid crystal polymer (A) has a melting point of 250° C. or more.

4. The low dielectric resin composition according to claim 1, wherein the polar group is an epoxy group.

5. The low dielectric resin composition according to claim 1, wherein the graft-modified polyolefin (B) is a polyolefin graft-modified with glycidyl (meth)acrylate and styrene.

6. A molded article comprising the low dielectric resin composition according to claim 1.

7. A film comprising the low dielectric resin composition according to claim 1.

8. A multilayer film comprising:
the film according to claim 7; and
a metal foil provided on at least one main surface of the film.

9. A flexible printed wiring board comprising the film according to claim 7.

10. The low dielectric resin composition according to claim 1, wherein a total mass percentage of the liquid crystal polymer (A) and the graft-modified polyolefin (B) based on a total mass of the low dielectric resin composition is 95% by mass or more.

11. The low dielectric resin composition according to claim 1, having the sea-island structure and a co-continuous structure, wherein:
the liquid crystal polymer (A) comprised in the sea-island structure is a sea component of the sea-island structure, and
the co-continuous structure comprises the liquid crystal polymer (A) and the graft-modified polyolefin (B) having a polar group.

* * * * *